United States Patent [19]
Gentili

[11] 4,133,051
[45] Jan. 2, 1979

[54] INFORMATION REFRESHING SYSTEM IN A SEMICONDUCTOR MEMORY

[75] Inventor: Claudio Gentili, Cornaredo (Milan), Italy

[73] Assignee: Honeywell Information Systems Italia, Caluso, Italy

[21] Appl. No.: 535,267

[22] Filed: Dec. 23, 1974

[30] Foreign Application Priority Data

Dec. 27, 1973 [IT] Italy .............................. 32159 A/73

[51] Int. Cl.$^2$ ...................... G11C 13/00; G11C 11/40
[52] U.S. Cl. ..................................... 365/222; 365/203
[58] Field of Search .................. 340/173 DR; 365/222

[56] References Cited
U.S. PATENT DOCUMENTS

| | | | |
|---|---|---|---|
| 3,737,879 | 6/1973 | Greene | 340/173 DR |
| 3,760,379 | 9/1973 | Nibby | 340/173 DR |
| 3,790,961 | 2/1974 | Palfi | 340/173 DR |
| 3,810,129 | 5/1974 | Behman | 340/173 DR |
| 3,811,117 | 5/1974 | Anderson | 340/173 DR |
| 3,858,184 | 12/1974 | De Vries | 340/173 DR |
| 3,858,185 | 12/1974 | Reed | 340/173 DR |

*Primary Examiner*—Terrell W. Fears
*Attorney, Agent, or Firm*—Milton M. Field

[57] ABSTRACT

A semiconductor memory is provided with means for refreshing the memory. Interrupt requests generated by the memory initiate refreshing cycles which are uniformly distributed during periods of normal operation of the memory, each cycle for a row of the memory. In a first time interval, an interrupt request has a low priority level and does not necessarily interrupt the operation of the computer. If the low priority interrupt request is not responded to, a second interrupt request with a high priority level is generated; this high priority level second interrupt request is responded to without fail.

1 Claim, 6 Drawing Figures

INFORMATION REFRESHING SYSTEM IN A SEMICONDUCTOR MEMORY

BACKGROUND OF THE INVENTION

The present invention relates to a system for ensuring regular information "refreshing" of the storage elements of a semiconductor read-write memory in electronic binary data processing apparatus.

In recent times, semiconductor storage systems have been largely employed as the main memories in data processing apparatus. These memories, which are produced as large-scale integrated circuits having high density and a high number of elements, have shown remarkable advantages over conventional memories employing magnetic elements, with regard to operating speed, fabrication costs, and reliability. However, their use requires peculiar care, in view of the fact that they are intrinsically "volatile", that is, the registered information fades out with the passing of time and may become completely lost. Therefore, these memories must be "refreshed" periodically; that is, the stored information must be rewritten; and it is necessary to make sure that this refreshing operation is carried out within a defined time interval from the previous such operation.

Prior information refreshing systems refresh the whole memory, row after row in succession, at the end of the maximum time interval allowed. This method has the drawbacks of submitting the whole system to a massive power demand in a single small time interval and of requiring the stopping of all normal memory operation during this interval; it is also subject to the risk that in case the refreshing is not carried out, for any accidental reason, the memory content may be partially or totally lost.

SUMMARY OF THE INVENTION

The device according to the invention obviates these shortcomings by suitably and uniformly distributing the refreshing cycles in a convenient time interval, each cycle providing the refreshing of a row of the memory, and being inserted at regular intervals in periods of normal operation of the memory.

According to the invention, each refreshing cycle is effected in response to the emission, by the memory, of an interrupt request, having, in a first time interval, a low priority level, thus not necessarily interrupting the operation of the computer. Only in case this low priority request is not satisfied, is a second interrupt request sent out; the second interrupt request, having a high priority level, is absolutely satisfied. Thus, on the one hand, it is guaranteed that the whole memory is refreshed within the maximum allowed time; and, on the other hand, sufficient flexibility in the interaction between the memory and the central processor is maintained.

These and other features and advantages of the invention will appear clearly from a detailed description of a preferred embodiment thereof, and from the attached drawings.

DETAILED DESCRIPTION OF THE PREFERRED EMBODIMENT

The semiconductor memory to which the present invention is applied is a memory organized for a maximal planned number (in the example, four) of memory "modules." The modules effectively installed may be less than four, according to the required capacity of the memory. Each module comprises a variable number (in the example, one to eight) of "submodules." According to the preferred embodiment, each submodule comprises two printed-circuit cards, on which the integrated memory units and the control circuits needed for their operation are mounted.

Each memory card carries 36 integrated memory units, having a capacity of 1024 bits each. The 36 units are arranged in four rows of nine each. Each one of the first eight integrated units of each row is intended for recording the bits of the same order of 1024 eight-bit half-words (bytes). The ninth unit of each row is intended to record the 1024 parity check bits assigned to each half-word. Each card therefore may record 4096 bytes, and each submodule 4096 words having 16 information bits and two check bits. The submodule, the capacity of which approximates 4000 words, is the minimum modular unit of the memory: the memory capacity may therefore range from a minimum of 4000 words to a maximum of four modules each having a 32,000 word capacity — that is, a maximum of 128,000 words each having 16 information bits.

For a better understanding of the invention, the layout and the operation of a 1024 bit integrated semiconductor memory unit, including the built-in control, selection and clock circuits is hereafter described. Such integrated memory units are available on the market, under code number 1103, from the Intel Corporation, Santa Clara, Calif., and are fully described both by the technical papers of the producers, and, for instance, in the article "Application Considerations for Read-Write Memory," by M. E. Hoff, appearing in the book Semiconductor Memories, published by Wiley-Interscience in 1971. It is, on the other hand, apparent that the application of the invention is not limited to the integrated memory units of the cited producer, but that it may be carried out on memories employing semiconductor units having substantially equivalent features, by applying such modifications as are known to anyone skilled in the art.

Figure 1:
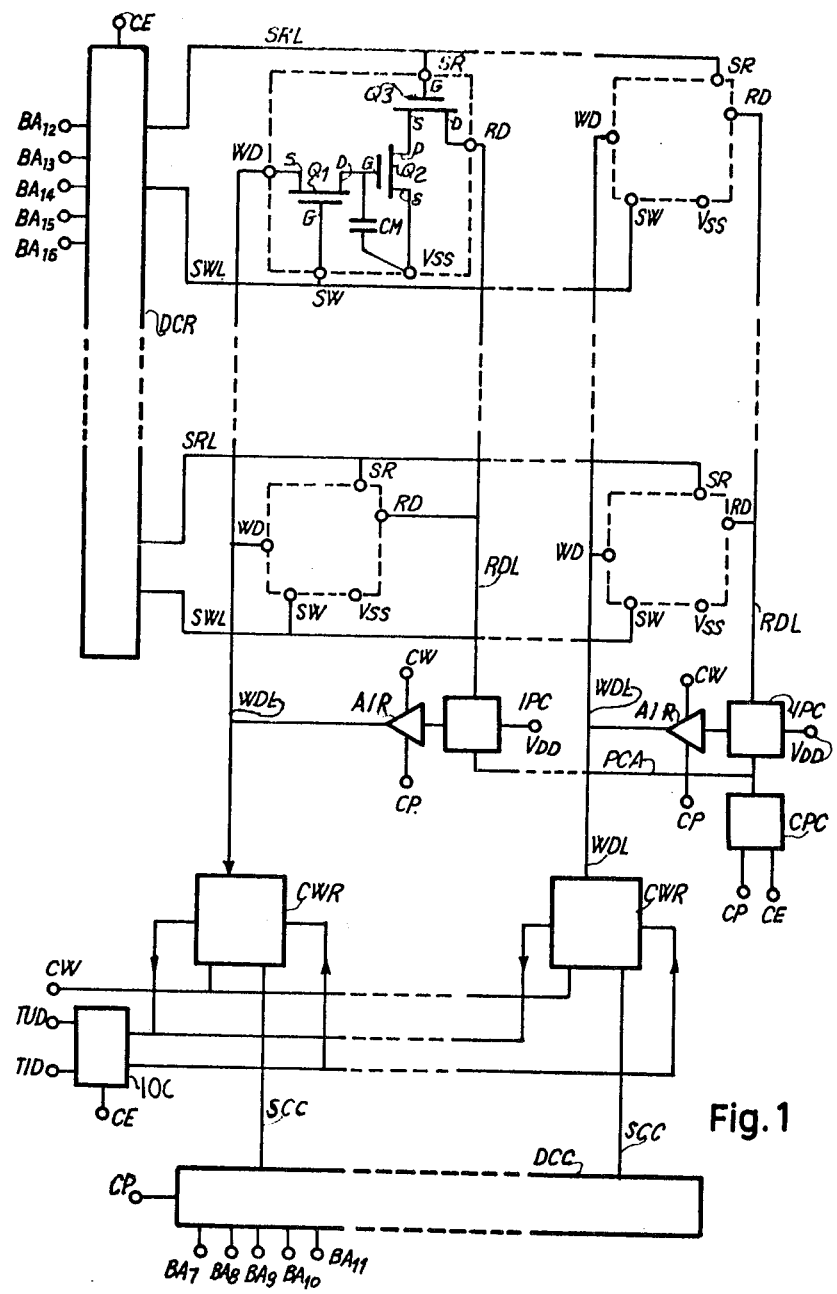
FIG. 1 is a simplified diagram of an integrated semiconductor memory unit of known type.

FIG. 1 shows the wiring block diagram of such an integrated memory unit, comprising 32 rows and 32 columns of elementary memory cells. Only the blocks representing the first and the last cells of the first and of the last row are shown therein, the simplified circuit of a cell being shown in the interior of the first block of the first row. The cell comprises three field effect transistors $Q_1$, $Q_2$ and $Q_3$, each one of these having a source terminal S, a drain terminal D, and a gate terminal G. When a positive voltage $V_{SS}$ (in the example, +16 V.)

is applied to the S terminal, while the D terminal is at a voltage $V_{DD} = 0$ V., the transistor conducts between S and D if the G terminal is at a voltage $V_{DD} = 0$ V., and does not conduct if the G terminal is at a voltage of $V_{SS} = 16$ V. The voltage $V_{SS} = 16$ V. corresponds to binary ZERO, the voltage $V_{DD} = 0$ V. to binary ONE.

To prevent secondary effects, the semiconductor substrate on which the integrated circuit is deposited, is kept at a positive voltage $V_{BB}$ approximately equal to 20 V. For simplicity, in FIG. 1, $V_{BB}$ is assumed to be equal to $V_{SS}$.

The information is recorded in the stray capacity CM between the substrate and the lead connecting the D terminal of $Q_1$ to the G terminal of $Q_2$. If the registered information is ONE, this lead is at voltage $V_{DD}$ (0V.), the capacitor CM is charged, the G terminal of $Q_2$ is at 0V., and $Q_2$ is conducting. If the information is ZERO, the capacity is not charged, and $Q_2$ does not conduct. The cell has four control terminals SR (Read Selection), RD (Data Read), WD (Data Write), and SW (Write Selection) and a feed terminal $V_{SS}$.

In order to read the information recorded in the cell, the terminal RD is "precharged," that is, brought to $V_{DD}$ for a suitable time interval (about 125 nanoseconds). Then the voltage $V_{DD}$ is cut out, and the transistor $Q_3$ is made conductive by applying a ONE signal $(V_{DD})$ to the terminal SR. If the recorded information is ONE, $Q_2$ conducts, the terminal RD is connected to $V_{SS}$ through $Q_2$, and $Q_3$ and goes over to voltage $V_{SS}$, that is, to binary ZERO. If the recorded information is ZERO, $Q_2$ does not conduct, and RD remains at $V_{DD}$, that is, at binary ONE. The output is read out by sensing the voltage of terminal RD in a very short time interval (50 ns.) following the end of the precharge and is inverted with respect to the recorded information.

To write, a voltage $V_{DD}$ or $V_{SS}$, according to whether a ONE or a ZERO is to be written, is applied to terminal WD; and a signal ONE is applied to SW, thus making $Q_1$ conductive and therefore charging or discharging the capacitor CM.

As may be seen, the reading out, in itself, is not destructive of the recorded information; however, due to the low insulation of the capacitor CM, it is necessary to rewrite the recorded information periodically, and this is done every time the information is read out. It is prescribed that this rewriting, or "refreshing," of the information must take place within a maximum time interval of two milliseconds from the last read-write operation.

The various operations are controlled by three clock signals, that is, the precharge clock CP, the enable clock CE, and the write clock CW. The first two clocks are periodically sent to the memory at each memory cycle and control the read and refresh operations; the third is sent to the memory only during the write cycles.

The 32 read selection (SR) terminals of each row are connected to a single row read selection lead SRL, and each one of these leads is connected to one of 32 output terminals of a row decoder DCR, which has five inputs, to which the five bits, forming the row address code $BA_{12}$ to $BA_{16}$, are applied. The decoder is enabled by the enable clock signal CE.

Also, the 32 write selection terminals SW of each row are connected to a single one of 32 write row selection leads SWL, each one of which is connected to one of 32 output terminals of the same row decoder DCR. This decoder may therefore enable all the 32 memory cells of a selected row, both for reading and for writing.

The 32 data read terminals RD of each column are connected to a single one of 32 data read leads RDL, one for each column. Each one of these is connected to an output of a precharge switch IPC, controlled by a common lead PCA connected to the output of a precharge control switch CPC, which in turn is controlled by the precharge clock CP and the enable clock CE. The lead PCA goes over to binary ONE when, CE being at ZERO, CP goes to ONE. In this condition, the switches IPC apply the voltage $V_{DD}$ to the leads RDL, thus starting the precharge process.

The precharge ends when CE goes to ONE and PCA to ZERO. During the interval between this instant and the subsequent going to ZERO of CP, the lead RDL is at binary ZERO or ONE according to the information recorded in the cell. This value, which is inverted with respect to the recorded information, is applied to the input of a refresh inverter amplifier AIR controlled by clocks CP and CW. The output of the inverter amplifier AIR is enabled only if CW is ZERO, that is, only during the reading and refreshing cycles, but not during the write cycles. The output of each amplifier AIR is connected to the write lead WDL to which the WD terminals of the corresponding column are connected. Therefore, the voltage corresponding to the inverted information recorded in the cell is applied to these terminals; and, as only the data write terminals of the selected row are enabled, the recorded information is rewritten in the selected cell.

The output of the amplifier AIR and the data write lead WDL of each column are connected to an input terminal of a column write-read switch CWR which is selected by one of 32 column selection leads SCC connected to the output terminals of a column decoder DCC, which has five input terminals to which the five column address bits of the address code $BA_7$ to $BA_{11}$ are applied. The switches CWR are controlled by the clock CW, which, when it is at ZERO, enables the read-out data to be applied to an input-output circuit IOC during the read cycles, and to be available on the data output terminal TUD. The input data are applied at the data input terminal TID, and through the same input-output circuit IOC to the CWR switch of the selected column. They are transmitted to the write column lead WDL only if CW is at ONE, that is, during a write cycle. As said, the signal CW at level ONE inhibits the refresh amplifier AIR and therefore the read-out data are not transferred to the write input of the selected cell.

It may be noted from the aforesaid that, in the first place, the precision of the time interval occurring between the going over to ONE of the clock CE and the following return to ZERO of the clock CP is important, because it is during this interval that the data read terminal of the selected cell applies to the input of the amplifier AIR the inverted value of the read out information. In the considered example, this interval must be shorter than 75 ns. and longer than 25 ns. In the second place, it may be seen that the refreshing of the recorded information in every cell of each row takes place every time a cell of the same row is read out. However, a row refresh operation differs from a cell read-out operation only by the circumstance that in the former case no column is selected for reading out.

Each integrated unit has the following eighteen terminals: three for the feeding voltages $V_{SS}$, $V_{DD}$ and $V_{CC}$; ten for the address bits $BA_7$ to $BA_{16}$; three for the clock signals CP, CE, and CW; one for the data input; and one for the data output.

Each memory card (FIG. 2), corresponding to a half-submodule, carries four rows of nine integrated units each, and may record 1024 half-words of eight information bits and a check bit. The 16 information bits and the two check bits of a word are recorded in the cells of the same address of the units of the same row; the bits 0–7 of a word are recorded in the first eight units of a row of the first card, the bits 8–15 of the same word are recorded in the first eight units of the same row of the second card. The last units of both rows record the check bit, the check bit of the first half-word being recorded by the last unit of the second card, and the check bit of the second half-word being recorded by the last unit of the first card. This is done to increase the error detecting efficiency of the check bits. An error generated, for instance, by the address amplifiers of a card could in effect cause a half-word and its check bit to be written at a wrong address. Such an error could not be detected by the parity check if the same set of address amplifiers would control both the information bits and the check bit. The same could happen for an error due to malfunctioning of the devices controlling the read-write operations.

By this arrangement, that is, by locating the check bit recording units on a card different from the one for the information bits, the error may affect either the former or the latter only, and may be detected by the parity check. As the computer is able, according to the conditions, to write either a single half-word at a time, or both half-words in a single operation, the read-write control signal of the check bits must be independent from the read-write control signals for the information bits. As a matter of fact, if, for instance, the first half-word is written, and not the second one, the write control signal of the check bit of the first half-word, which is recorded on the second card, must be emitted even if the write control signal for the information bits of the second card is not emitted.

Figure 2:
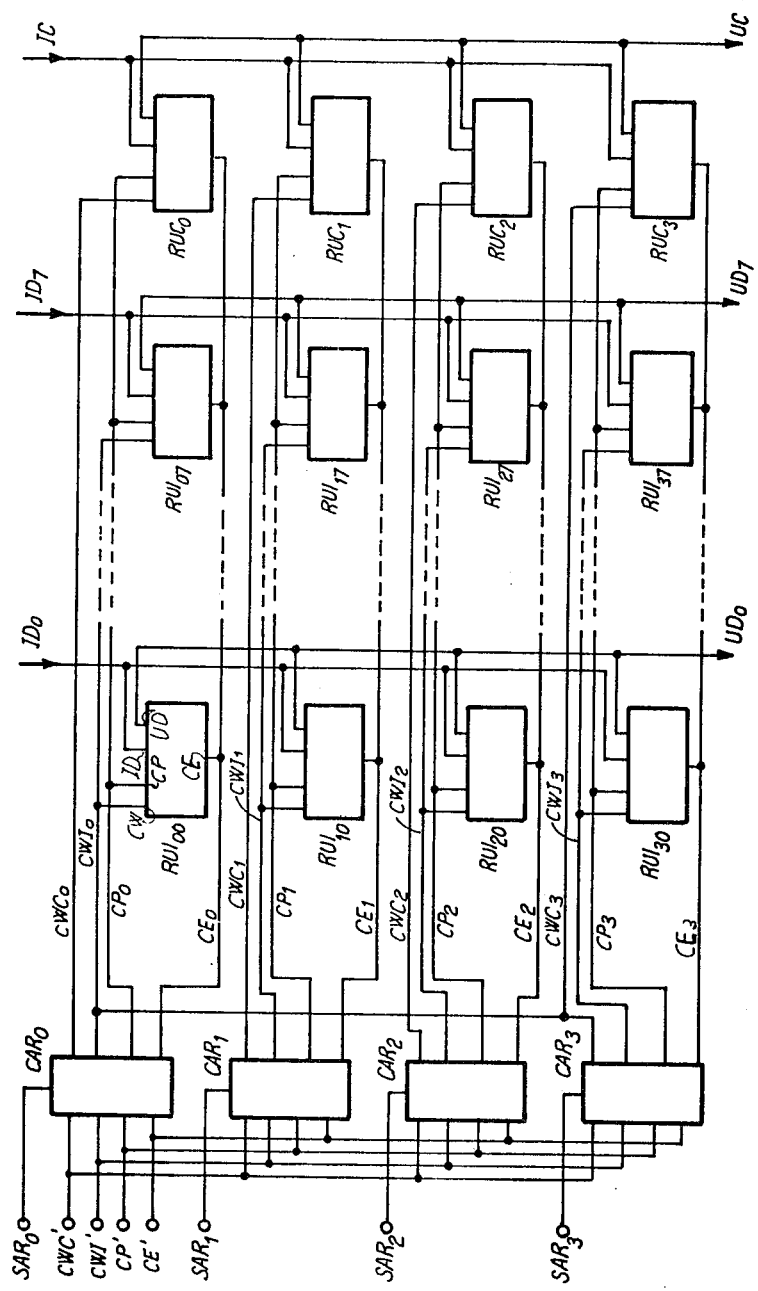
FIG. 2 is a simplified wiring diagram of an assembly of a number of said integrated units and part of its control circuits on a printed circuit card.

FIG. 2 shows the layout and the connections of the integrated units arranged in four rows on a card. The eight integrated units of the first row, intended for recording the information bits, are indicated by $RUI_{00}$ to $RUI_{07}$, and the integrated unit of this row intended for recording the check bits is indicated by $RUC_0$. Similarly, $RUI_{10}$ to $RUI_{17}$ and $RUC_1$ indicate respectively the information bit recording units and the check bit recording unit of the second row; and $RU_{20}$ to $RU_{27}$ and $RUC_2$, and $RU_{30}$ to $RU_{37}$ and $RUC_3$ to the corresponding units respectively of the third and fourth row. Each one of the ten address terminals ($BA_7$ to $BA_{16}$) of each integrated unit is connected to all the homologous terminals of the other units by "bus" leads which are not shown in the drawing. The same holds for the feed terminals $V_{SS}$, $V_{DD}$ and $V_{BB}$. The terminals CP and CE, for the precharge and enable clock signals of the integrated units of each row are parallel connected to the leads $CP_0$, $CP_1$, $CP_2$, and $CP_3$, and respectively, $CE_0$, $CE_1$, $CE_2$, and $CE_3$.

For each row, two leads are assigned to the clocks CWI (write clock for the information bits) and CWC (write clock for the check bits); more precisely, the leads $CWI_0$ to $CWI_3$ are connected to the CW terminals of the information recording integrated units (RUI) of the respective rows; and the leads $CWC_0$ and $CWC_3$ are connected to the terminals CW of the integrated units for the check bits of the respective rows.

These four clock leads of each row are connected to the four outputs of a group of controlled amplifiers, respectively indicated by $CAR_0$ to $CAR_3$. The four clock signals are parallel applied to the four inputs of each group through four common terminals CWC', CWI'n, CP' and CE'. For each operation, only one of the four amplifier groups is enabled by a row selecting signal, respectively, $SAR_0$ to $SAR_3$.

The row selecting signals and the clock signals applied to the inputs of these controlled amplifiers must be consistent with the standards adopted for the computer circuits: for instance, as in the example considered, the transistor transistor logic (TTL), which uses, for binary ONE, +3.5 V., and for the ZERO, 0 V. The output signal of each amplifier must be consistent with the standard required for field effect transistors, also called MOS (metal-oxide semiconductor), standard. This standard calls for 0 V. as binary ONE and +16 V. as binary ZERO.

Figure 3:
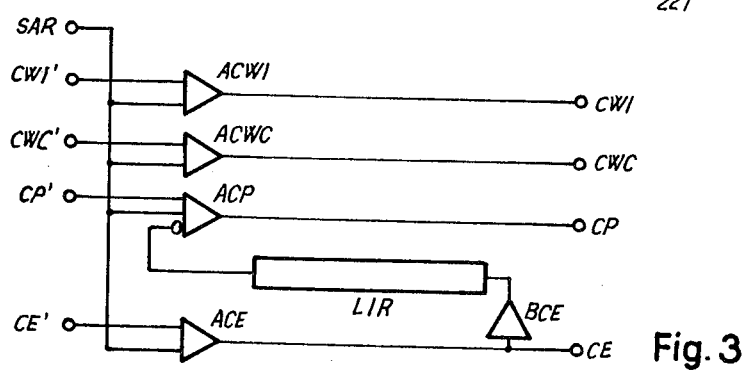
FIG. 3 is the wiring diagram of a group of clock amplifiers provided with a delay line.

FIG. 3 shows in better detail the connections of the amplifiers of a CAR group, and illustrates an arrangement adopted in order to guarantee the precision of the time interval between going over to ONE of the clock CE and the falling to ZERO of the clock CP, which defines the reading time for the data output. The write clocks, CWI' for information bits, and CWC' for check bits, generated by the clock generating circuit of the module, (see later), are amplified and transformed into MOS standard by the controlled amplifiers ACWI and ACWC, which may be enabled by the row selecting signal SAR, and are available at the outputs CWI and CWC. The controlled amplifier ACE, which is enabled by the row selection signal, transforms the clock CE from TTL to MOS standard and makes it available at the output terminal CE. This clock signal is also applied to the input of an amplifier BCE which retransforms it to TTL standard and applies the same to the input of a delay line LIR. The precharge clock signal emitted by the clock generator is applied, through the CP' terminal, to a controlled amplifier ACP which may be enabled by the row selection signal and inhibited by the signal at the output of the delay line LIR. The precharge clock signal from the clock generator is so adjusted, as to be somewhat longer than the maximum required value. Therefore, the output CP returns to ZERO after a time interval, from the going over to ONE of the enable clock CE, due to the propagation time of the delay line. This time interval, during which both clocks CP and CE are at ONE, is defined by the propagation time and by the response times of the amplifiers BCE and ACE with a precision higher than the one attainable if both clock signals were delivered directly by the clock generator of the module.

Figure 4:
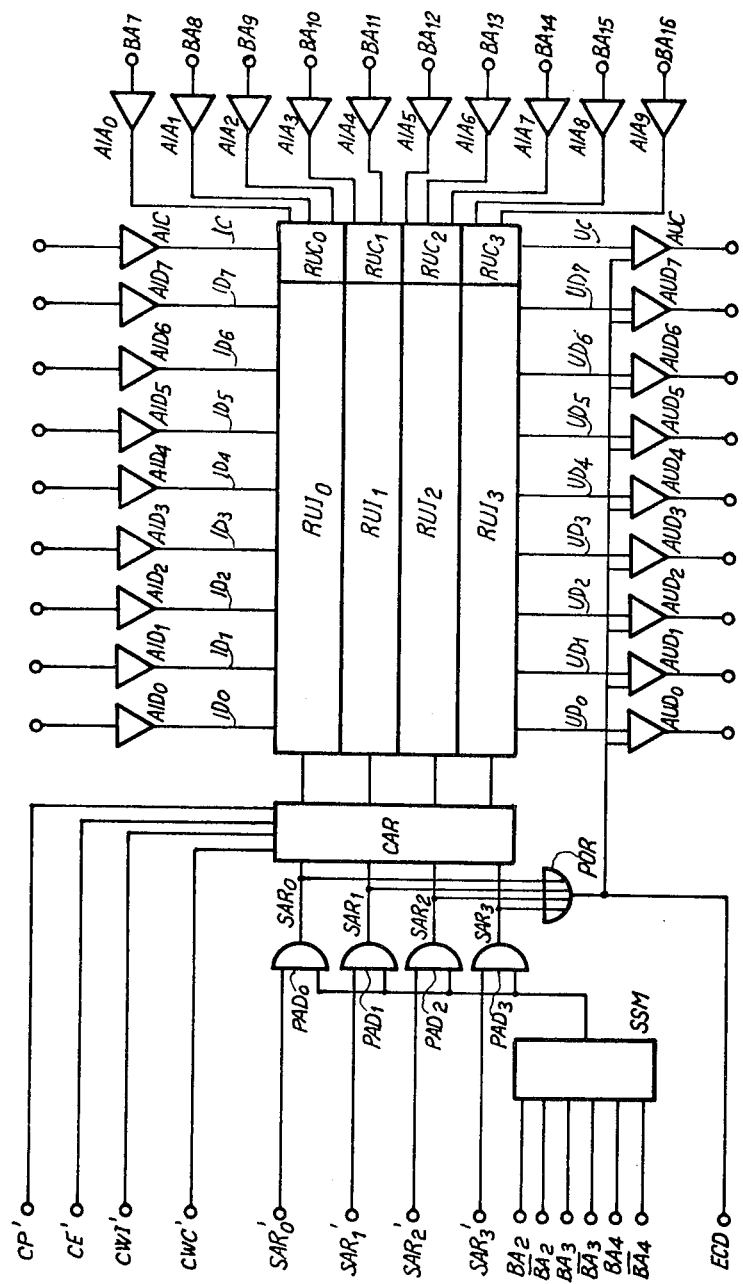
FIG. 4 is a schematic wiring diagram of a printed circuit card for the integrated semiconductor memory elements and of the related control circuits.

FIG. 4 shows the devices and the circuits mounted on a card. Reference letters RUI indicate the four rows of eight integrated units each for information bits, and RUC indicate the four units for check bits. The data input terminals of the integrated units of each column are parallel connected to one of the eight leads $ID_0$ to $ID_7$ to which the eight information bits to be written in the memory are applied; the data output terminals of the units of each column are similarly parallel connected to one of the eight leads $UD_0$ to $UD_7$, on which the eight read out information bits are available. The check bits at the input and at the output are respectively carried by leads IC and UC connected to the data input and data output terminals of the integrated units $RUC_0$ to $RUC_3$. CAR denotes the aggregated four groups of controlled amplifiers $CAR_0$ to $CAR_3$ of FIG. 2. They provide the ability to transfer the clock signals CP', CE', CWI' and CWC' on the row selected by the row selection line $SAR_0$ to $SAR_3$ on which appears a signal ONE.

Each row selecting lead is connected respectively to the output lead of an AND gate ($PAD_0$ to $PAD_3$) whose first input is connected to the row selection terminal ($SAR_0'$ to $SAR_3'$), to which the signal indicating the selected row is applied. The second inputs of these gates are connected in common to the output of a submodule selector SSM, having six inputs to which the direct and inverse values of the three submodule selection bits $BA_2$, $BA_3$, and $BA_4$ are applied. The submodule selector SSM enables the PAD gates only when a specific pattern of direct and inverse values of these three bits, forming the submodule address, is applied thereto, and, in addition, also when all six inputs are at value ONE. In this case, all the connected submodules are enabled.

The outputs of the four gates $PAD_0$ to $PAD_3$ are connected to the inputs of an OR gate POR whose output, on the one hand, enables the data output amplifiers $AUD_0$ to $AUD_7$ and AUC (as explained further on), and, on the other hand, is connected to an output terminal ECD, producing a signal (called the ECO signal) which confirms to the central processor that the selected submodule is connected and operating.

The eight data inputs $AID_0$ to $AID_7$ amplify the input data and transform them from TTL to MOS standard. Their outputs are parallel connected to the data input terminals of the four integrated units of each column. The eight data output amplifiers $AUD_0$ to $AUD_7$ have their inputs connected to all the data output terminals of the four integrated units of each column; they amplify the data output signals and transform them from MOS to TTL standard. The same functions are performed, with respect to the input and output check bits, respectively, by the input amplifier AIC and the output amplifier AUC.

The ten address bits $BA_7$ to $BA_{16}$, which select a single cell within each integrated unit, are amplified and transformed from TTL to MOS standard by the ten address amplifiers $AIA_0$ to $AIA_9$.

In the example under consideration, the refreshing of the memory is obtained by means of 32 refreshing cycles effected in succession; each of the cycles provides for refreshing one of the 32 rows of all the connected integrated units for the whole memory capacity installed. During each cycle, the five row address bits $BA_{12}$ to $BA_{16}$ are replaced by five bits generated by a counter, which generates, in sequence, the 32 address codes for the 32 rows. A refreshing logic circuit, shown in FIG. 5, may receive from the central processor the following signals: a STR start signal, indicating that the central processor requires that a memory cycle be effected; a RCC refreshing signal, indicating that the requested cycle must be a refreshing cycle; a RSI reset signal, which is intended for suspending the operation of the central processor and for resetting to zero all the registers of the computer. In this case, as the memory content must not get lost, the refreshing logic circuit generates a periodical internal start signal, which is provided to carry on the refreshing operation even in the presence of the reset signal.

The refreshing logic circuit may send to the central processor either one or the other of two interrupt signals IBP and IAP, requesting the stopping of every other operation of the central processor and the emission of the ATR and RCC signals required for effecting a refreshing cycle. The first interrupt signal IBP has a relatively low priority level and may be disregarded if the central processor is busy with higher priority operations (such as disk operations). The high priority interrupt signal IAP is sent out if the first interrupt signal has not been responded to, that is, if the requested signals have not been emitted. Since interrupt signal IAP has absolute highest priority, it causes these signals to be unconditionally emitted.

The refreshing logic circuit is mounted on each memory module for 32,000 words. However, if more than one of these modules are installed, the refreshing operations are controlled by a single one of these circuits, to prevent an excess of refreshing requests.

The 32 refreshing cycles, continuing approximately 1 microsecond each, are not effected in immediate succession at the end of the allowed maximum interval of 2 milliseconds as required for preventing any loss of information, but at intervals of approximately 31 microseconds; therefore each row is refreshed, in normal operation, after about one millisecond.

However, if the low priority interrupt signal has not been responded to, during the following 31 microsecond interval the high priority interrupt request is sent out; and this signal is responded to without fail. Therefore, in the most unfavorable case, when the high priority signal must always be sent, the memory is refreshed every 2 milliseconds approximately, or more precisely, every 32 times 62 microseconds (1,984 microseconds or 1.984 milliseconds).

Figure 5:
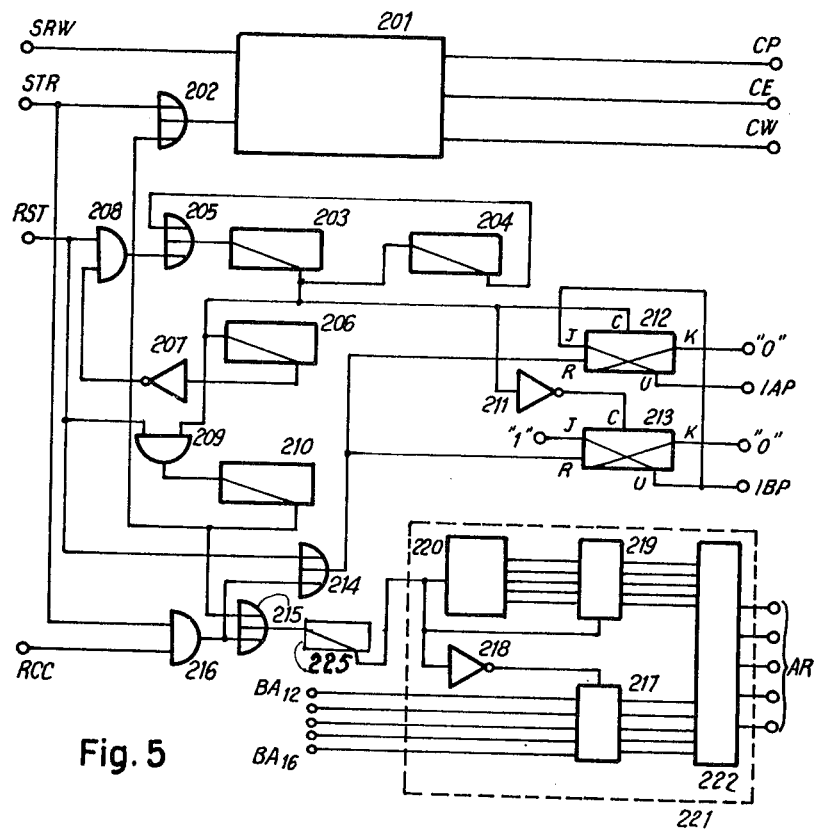
FIG. 5 is a simplified wiring diagram of the memory refreshing circuit according to the invention.

The refreshing logic circuit, as shown by the wiring diagram of FIG. 5, comprises an asymmetric wave generator, including two one-shot circuits 203 and 204, having different operating times. The one-shot 203, for instance, has, at rest conditions, its output at ZERO level, goes over to ONE level when a falling front (a transition from ONE to ZERO) is applied at its input, and returns to the rest condition after 27 microseconds. The falling front on the output lead, applied to the input of the one-shot 204, brings its output to ONE; this output returns to ZERO after 4 microseconds. This latter falling front, in turn, is applied to the input of the one-shot 203 through an OR gate 205, bringing its output to ONE, and the process is repeated indefinitely. At the output of the one-shot 203 there is a sequence of square wave signals of level ONE, during 27 microseconds, separated by intervals of level ZERO during 4 microseconds: the complete cycle has a period of 31 microseconds.

The output of the one-shot 203 is directly connected to the clock input C of a flip-flop 212, and, through the inverter 211, to the clock input C of a second flip-flop 213. These flip-flops are of the so-called J-K type and are designed to be controlled by a falling front (from ONE to ZERO) applied to the clock input C. In response to this front, the direct output of the flip-flop goes over to level ONE, if at input J there is applied a level ONE, and at input K a level ZERO. If at both inputs a level ZERO is applied, the output remains at ZERO. There is, in addition, a reset input R which resets the flip-flop to rest conditions (ZERO level) when a signal ONE is applied thereto.

The input J of the flip-flop 213 is permanently kept at level ONE, whereas the input J of flip-flop 212 is connected to the output U of flip-flop 213. The inputs K of both flip-flops are permanently at ZERO. The direct outputs U of flip-flops 213 and 212 provide, respectively, the low priority (IBP) and the high priority (IAP) interrupt requests.

Both reset inputs R are connected to the output of the OR gate 214, having an input connected to the RST signal terminal and the other input to the output of an AND gate 216 having its inputs connected to the STR and RCC signal inputs.

The start signal STR emitted by the central processor is applied, through an OR gate 202, to a clock generator 201 (not described, but of known type), which generates the clock signals needed for the operation of the memory, that is, the CP and CE signals, and, in case of write operations, the signal CW, in response to the start signal. The signal CW is emitted or not, according to the value of the signal SRW sent by the central processor, that is according to whether the memory cycle must be a write cycle or a read or refreshing cycle. The start signal STR may be emitted by the central processor either independently, according to the requirements of the data processing under way, or in response to an interrupt signal of low or high priority IBP or IAP, requesting a refresh cycle. In this case, the start signal is accompanied by a refresh signal RCC, which appears at the same time as STR, but is longer and encompasses the latter. Therefore, when a start signal STR and a refresh signal RCC reach the refreshing logic circuit, a signal STRC (refresh start signal) appears at the output of the AND gate 216; it is identical to the signal STR but is conditioned by the presence of the refresh signal RCC.

The reset signal RST, in general, has the functions of resetting to zero all registers and of interrupting the operation of the central processor. As this signal may last more than two milliseconds, and the memory contents must not get lost, an internal start signal STI is generated, during the reset signal, by the one-shot circuit 210, which has its input connected to the output of the AND gate 209 controlled by the RST signal. The other input of gate 209 is connected to the output of the one-shot 203. When the signal RST is at level ONE, the falling fronts of the oscillator formed by the one-shots 203 and 204 trigger the one-shot 210, which, therefore, emits every 31 microseconds, a signal of suitable length replacing the start signal. This is applied to an input of the OR gate 215, to one input of the OR gate 202, and, thereby, to the input of the clock generator 201.

The output of the one-shot 203 is also applied to the input of the one-shot 206 having an operation time longer than the 31 microsecond period, for instance, an operation time of 100 microseconds. This one-shot, therefore, is set in "up" condition by the first falling front at the output of the one-shot 203 and remains in this condition as long as the oscillator is operating, because the falling fronts therefrom, which follow at 31 microsecond intervals, retrigger it, and do not allow it to go down to rest condition.

The reset signal is applied to an input of the AND gate 208 having its other input connected through the inverter 207 to the output of the one-shot 206. The output of the AND gate 208 is connected through the OR gate 205, to the input of the one-shot 203. Therefore, when the computer is being energized, and all one-shots 203, 204, and 206 are in rest condition, a reset signal, which is automatically emitted, triggers the one-shot 203 and starts the oscillator: the one-shot 206 goes to "up" condition, and its output signal, inverted by the inverter 207, inhibits the AND gate 208 preventing any other reset signal from possibly disturbing its operation. Usually, the oscillator 203–204 is steadily operating: if, for any reason, it stops, the sending of the reset signals permits it to resume its operation.

The internal start signal STI and the refresh start signal STRC are mutually exclusive. They are applied by the OR gate 215 to the one-shot 225 which delivers at its output a prolonged start signal having a duration somewhat longer than a memory cycle. This signal is applied to a row addressing circuit 221, which comprises a counter 220 which counts the pulses applied at its input, and gives out, at its five outputs, an ordered sequence of 32 five-bit codes. It comprises also two sets of AND gates 219 and 217, an inverter 218 and a set of OR gates 222. The prolonged start signal lets the counter advance a step at a time, and alternatively, when it is at ONE value, enables the set of gates 219 and inhibits the set of gates 217; thus, the five-bit code generated by the counter 220 is applied through these gates and the set of OR gates 222 to the row address leads AR. Alternatively, when it is at ZERO value, the gates 219 are inhibited, the gates 217 are enabled, and therefore the five row addressing bits $BA_{12}$ to $BA_{16}$, emitted by the central processor, and applied to the inputs of the set of gates 217, may reach the row addressing leads AR through the OR gates 222. Summing up, the row addressing leads AR, which deliver the row addressing code to all the integrated units, are normally fed by the five-bit row address emitted by the central processor, but, during the refreshing cycles are fed by the addresses generated by the counter 220.

The operation of the refreshing logic circuit is as follows. The oscillator 203–204 delivers the square waves of 31 microsecond period: the rising fronts which take place at the beginning of the period are applied, through the inverter 211, to the clock input of the flip-flop 213 and, as the J input of the same is always at ONE level, they cause the emission of the low-priority interrupt signals IBP. In normal operation, the central processor answers this request by emitting the STR and RCC signals which, through the gates 216 and 214, reset the flip-flop 213. Twenty seven microseconds after the beginning of the period, the oscillator emits a falling front which, applied to the clock input of flip-flop 212, sets it to "up" condition; but, as the flip-flop 213 has already been reset, its output applies to the J input of flip-flop 212 a ZERO value and the output of 212 remains therefore at ZERO. No high priority request signal IAP is emitted.

On the other hand, if the low priority signal has failed to cause the emission of the signals STR and RCC, the flip-flop 213 remains in the "up" condition, its output remains at level ONE, and the falling front, applied to the clock input of flip-flop 212 causes its output to go over to ONE, producing the high priority request signal IAP. This causes the unconditioned emission of the signals STR and RCC. In any case, the emission of these signals causes the emission of the prolonged start signal which, as already explained, lets the counter 220 step-on, inhibits the gates 217, and enables the gates 219, thus replacing the address delivered by the central processor by the address generated by the counter 220. This process is repeated 32 times per millisecond, at intervals which may be 31 or 62 microseconds until, after 32 refreshing cycles, each one lasting one microsecond, all rows of the integrated units of the memory have been refreshed.

During the reset signal, the AND gate 209 is enabled; and the falling fronts generated by the wave generator, trigger the one-shot 210 every 31 microseconds, which emits the internal start signal STI. This is transmitted through the gate 215 to the one-shot 225 and produces the same effects as the STR signal.

Figure 6:
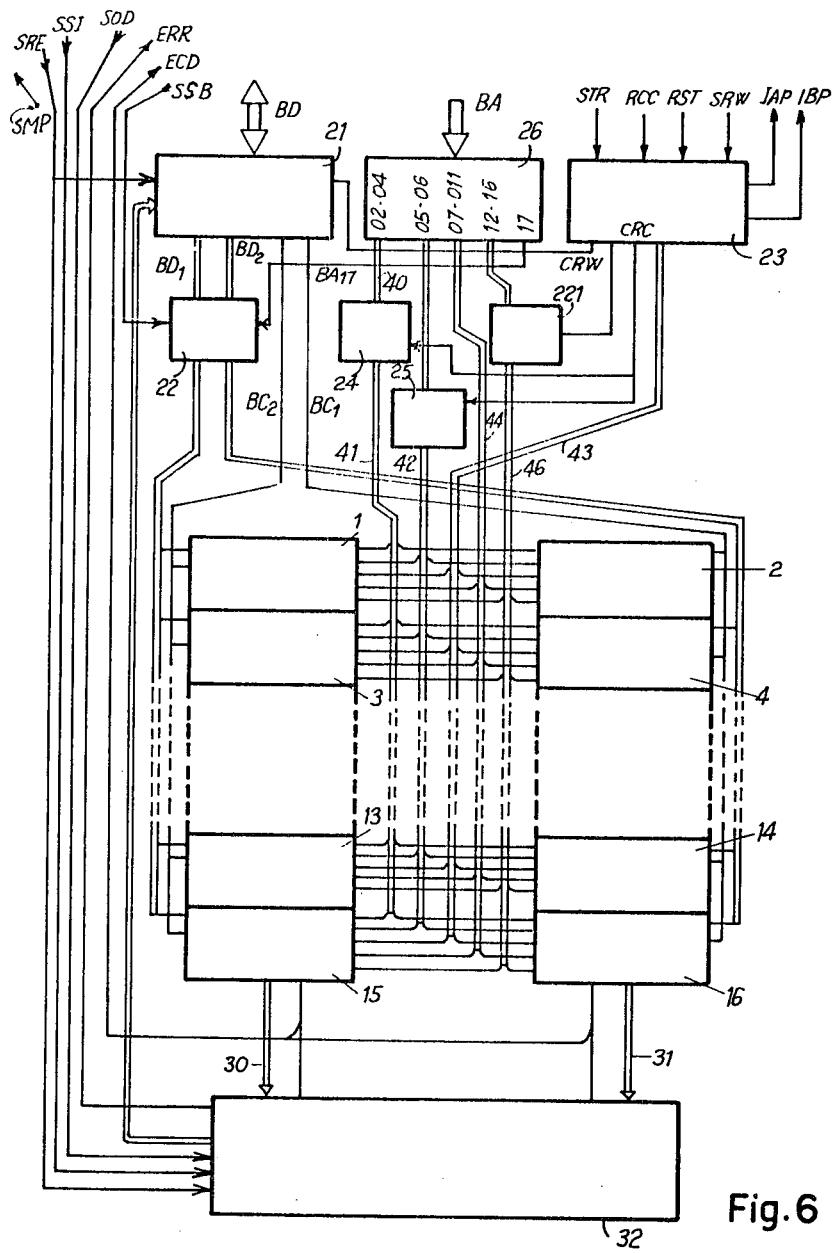
FIG. 6 is a schematic block diagram of the general layout of a memory module and its interface with a central processor unit according to the invention.

FIG. 6 is the schematic block diagram of the general layout of a memory module and its interface with the central processor. As stated above, each module comprises up to 8 submodules, and each submodule comprises two printed circuit cards. In FIG. 6, the reference numerals 1 and 2 indicate respectively the first and the second card of the first submodule, 3 and 4 those of the second submodule, and so on; 15 and 16 indicate the first and second card of the last submodule.

The words recorded in the memory are made up of 16 information bits, consisting in two 8-bit half-words (bytes). The first half-word comprises the eight information bits $BD_0$ to $BD_7$ and is checked by the check bit $BC_1$; the second half-word comprises the eight information bits $BD_8$ to $BD_{15}$ and is checked by the check bit $BC_2$. In each submodule, the information bits of the first byte and the check bit of the second byte are recorded on the first card; and the information bits of the second byte and the check bit of the first byte are recorded on the second card.

FIG. 6 indicates by reference numeral 21 a terminal set of data registers connected to the central processor by a bidirectional channel BD for data interchange. The register set 21 is connected to the different parts of the memory by the following connections: a first half-channel $BD_1$ carrying the data of the first byte, the lead $BC_1$ for the check bit of the first byte, which is connected to second cards of the submodules, the second half-channel $BD_2$ for the data of the second byte, the lead $BC_2$ for the check bit of the second byte, connected to the first cards of the submodules. The half channels $BD_1$ and $BD_2$ pass through the switching device 22, controlled by a signal SSB from the central processor, and by the eighteenth address bit $BA_{17}$. Then the signal SSB is at ZERO, the first and the second bytes are written or read out, at the same time, respectively, at the first and second card of the addressed submodule. When the signal SSB, which has the meaning "write single byte," is at ONE, the reading takes place at the same time for both bytes from both cards; but the writing is carried out for the first byte only; and this first byte is written either on the first card or on the second card according to whether the address bit $BA_{17}$ is ONE or ZERO. Accordingly, the write clocks for the information bits of each card are controlled by the signal SSB and the bit $BA_{17}$, in a way not shown in the drawing and not described here in detail, independently from the write clocks of the check bits of the same card. A detailed description of this feature is irrelevant to an understanding of the invention, such feature being readily implemented by those skilled in the art.

Reference numeral 26 indicates the address register, connected to the central processor by an unidirectional 16-line channel BA. The full address of each memory position comprises 17 bits: the first two, $BA_0$ and $BA_1$, select the module in the central processor, and are not sent to the selected module. The channel BA therefore carries the remaining 15 address bits $BA_2$ to $BA_{16}$, the card addressing bit for single byte writing $BA_{17}$, and a check bit. As aforesaid, the bits $BA_2$, $BA_3$, and $BA_4$ are sent through the channel 40 to the circuit 24 which generates the direct and inverted values of these bits, which are sent by channel 41 to the submodule selectors of each submodule card. The circuit 24 is controlled by the signal CRC generated by the refreshing logic circuit and may bring all the six leads of channel 41 to value ONE, for enabling all submodules during refreshing cycles.

Bits $BA_5$ and $BA_6$ are decoded by decoder 25, controlled by the signal CEC, and produce four signals for selecting the row on all cards which are carried by the channel 42. They may all be brought to the value ONE during the refreshing cycle.

Bits $BA_7$ to $BA_{11}$, transmitted by channel 44, select the the cell column of the integrated units. The bits $BA_{12}$ to $BA_{16}$ select the cell row and may be replaced by the row address generated by the counter 220 of FIG. 5, being part of the device 221 controlled by the prolonged start signal as explained before. As aforesaid, the bit $B_{17}$ addresses the first or the second card of the submodules during the single byte writing.

The reference numeral 23 indicates a circuit which is substantially the same as that of FIG. 5, comprising the clock generator and the refreshing logic circuit. It receives the signals indicated therein from the central processor and emits, in addition to the already indicated signals, a CRC signal (practically coincident with the prolonged start signal) for controlling the devices 24 and 25 and a read/write signal CRW, depending on the SRW signal, for controlling the switching from sending to receiving of the set of data registers 21. The clock signals CP, CE and CW are sent to the submodules by the channel 43.

The data read out from the memory submodules are transmitted by the channels 30 and 31 to a diagnostic device 32, which, being irrelevant to an understanding of the invention, is not described herein. The ECD signal from each card is sent separately to the diagnostic device, and all of them are sent, on a single lead ECD to the central processor. The diagnostic device may send to the central processor an error signal ERR, and the central processor may send to the module a signal SOD causing the module to operate in a diagnostic mode in place of the normal mode; a signal SSJ for enabling a predetermined submodule to take over the particular function of a reserve or "jolly" submodule, in the case of memory reconfiguration; and a signal SRE for resetting to ZERO all the output registers facing the central processor, before beginning a new data transmission. Lastly, a signal SMP is provided for signalling to the central processor the presence and the operating condition of the module.

While a preferred embodiment of the invention has been shown and described, it will be apparent to those skilled in the art that changes can be made without departing from the principles and spirit of the invention, the scope of which is defined in the appended claims.

The invention claimed is:

1. In a data processing system comprising a central processor interactive with a plurality of peripheral units and a main working semiconductor memory by means of interrupt requests sent by said peripheral units and by said working memory to said central processor, said interrupt requests having relative priority with respect to each other, said semiconductor memory including a plurality of memory cells arranged in a plurality of rows each row of which must be refreshed within a predetermined time interval after the last preceding refreshing operation; a refresh control system comprising: refresh control means, including addressing means, responsive to a refresh command received from said central processor to sequentially refresh said rows of memory cells, one row at each receipt of said refresh command, timing means for generating a sequence of pulses having a preestablished repetition rate, first circuit means responsive to said timing means for generating an interrupt request signal of low relative priority in synchronism with said repetition rate, said first circuit means including means for extinguishing said interrupt request signal upon the occurrence of a responsive refresh command, and second circuit means responsive to said timing means and to said first circuit means to generate an interrupt request signal of highest relative priority if a refresh command is not received by said first circuit means within a preestablished interval following the generation of an interrupt request signal of said low relative priority.

* * * * *